US010374610B1

(12) United States Patent
Braun

(10) Patent No.: US 10,374,610 B1
(45) Date of Patent: Aug. 6, 2019

(54) RECIPROCAL QUANTUM LOGIC BASED CIRCUITS FOR AN A-AND-NOT-B GATE

(71) Applicant: Microsoft Technology Licensing, LLC, Redmond, WA (US)

(72) Inventor: Alexander L. Braun, Baltimore, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/130,370

(22) Filed: Sep. 13, 2018

(51) Int. Cl.
*H03K 19/195* (2006.01)
*H03K 19/21* (2006.01)
*G06N 99/00* (2019.01)
*H03K 17/92* (2006.01)
*H03K 19/00* (2006.01)

(52) U.S. Cl.
CPC ......... *H03K 19/195* (2013.01); *G06N 99/002* (2013.01); *H03K 17/92* (2013.01); *H03K 19/0008* (2013.01); *H03K 19/21* (2013.01)

(58) Field of Classification Search
CPC ......... H03K 19/195; H03K 3/38; H01L 27/18
See application file for complete search history.

(56) References Cited

U.S. PATENT DOCUMENTS 7,724,020 B2 5/2010 Herr
7,786,748 B1 * 8/2010 Herr .................. H03K 19/1952 326/3
7,977,964 B2 * 7/2011 Herr ....................... B82Y 10/00 326/4
10,084,454 B1 * 9/2018 Braun .................. H03K 19/195
10,103,735 B1 * 10/2018 Herr ..................... H03K 19/195
10,103,736 B1 * 10/2018 Powell, III ........... H03K 19/195
2002/0063643 A1 * 5/2002 Smith ................ H03M 1/0602 341/133
2003/0011398 A1 * 1/2003 Herr .................. H03K 19/1954 326/3
2003/0016069 A1 * 1/2003 Furuta .................... B82Y 10/00 327/367
2009/0153180 A1 * 6/2009 Herr ....................... B82Y 10/00 326/4
2010/0033206 A1 * 2/2010 Herr ....................... B82Y 10/00 326/4
2016/0013791 A1 * 1/2016 Herr ........................ H03K 3/38 326/5
2018/0226974 A1 * 8/2018 Harms ................. H03K 19/195

* cited by examiner

*Primary Examiner* — Jason Crawford
(74) *Attorney, Agent, or Firm* — Ranjeev Singh; Singh Law, PLLC

(57) ABSTRACT

Superconducting circuits-based devices and methods, including reciprocal quantum logic (RQL) based devices and methods are provided. In one example, a circuit for an A-and-not-B gate including an output terminal, a first input terminal for receiving a first set of single flux quantum (SFQ) pulses, and a second input terminal for receiving a second set of SFQ pulses is provided. The circuit further includes a first Josephson junction (JJ) coupled to receive the first set of SFQ pulses. The circuit further includes a second JJ, where the second JJ when positively biased is configured to negatively bias the first JJ such that the circuit is configured to not pass the first set of SFQ pulses to the output terminal only when the second set of SFQ pulses have arrived at the second input terminal prior to an arrival of the first set of SFQ pulses at the first input terminal.

20 Claims, 7 Drawing Sheets

RECIPROCAL QUANTUM LOGIC BASED CIRCUITS FOR AN A-AND-NOT-B GATE

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, a certain amount of power is wasted not only as a result of the requirement to maintain the state of the CMOS transistors, but also as a result of the current leakage.

An alternative approach to the use of processors and related components, based on CMOS technology, is the use of superconducting logic based devices.

SUMMARY

In one example, the present disclosure relates to a circuit for an A-and-not-B gate including an output terminal, a first input terminal for receiving a first set of single flux quantum (SFQ) pulses, and a second input terminal for receiving a second set of SFQ pulses. The circuit may further include a first Josephson junction (JJ) coupled to receive the first set of SFQ pulses. The circuit may further include a second JJ coupled to the first JJ, where the second JJ when positively biased is configured to negatively bias the first JJ such that the circuit is configured to not pass the first set of SFQ pulses to the output terminal only when the second set of SFQ pulses have arrived at the second input terminal prior to an arrival of the first set of SFQ pulses at the first input terminal.

In another aspect, the present disclosure relates to a circuit an A-and-not-B gate including an output terminal, a first input terminal for receiving a first set of single flux quantum (SFQ) pulses, and a second input terminal for receiving a second set of SFQ pulses. The circuit may further include a first Josephson junction (JJ) coupled to receive the first set of SFQ pulses, where the first JJ having a first end coupled to a first node and having a second end coupled to a ground terminal. The circuit may further include a second JJ having a first end directly coupled to the output terminal, where the second JJ when positively biased is configured to negatively bias the first JJ such that the circuit is configured to not pass the first set of SFQ pulses to the output terminal only when the second set of SFQ pulses have arrived at the second input terminal prior to an arrival of the first set of SFQ pulses at the first input terminal.

In yet another aspect, the present disclosure relates to a method of operating a circuit for an A-and-not-B gate, where the circuit includes an output terminal. The method may include receiving a first set of single flux quantum (SFQ) pulses via a first input terminal. The method may further include receiving a second set of SFQ pulses via a second input terminal. The method may further include passing the first set of SFQ pulses to the output terminal in response to a triggering of a first Josephson junction (JJ), coupled to the output terminal, unless negative biasing of the first JJ because of triggering of a second JJ coupled to the first JJ prevents the first JJ from triggering, where the triggering of the second JJ is caused at least by an arrival of the second set of SFQ pulses at the second input terminal prior to an arrival of the first set of SFQ pulses at the first input terminal.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
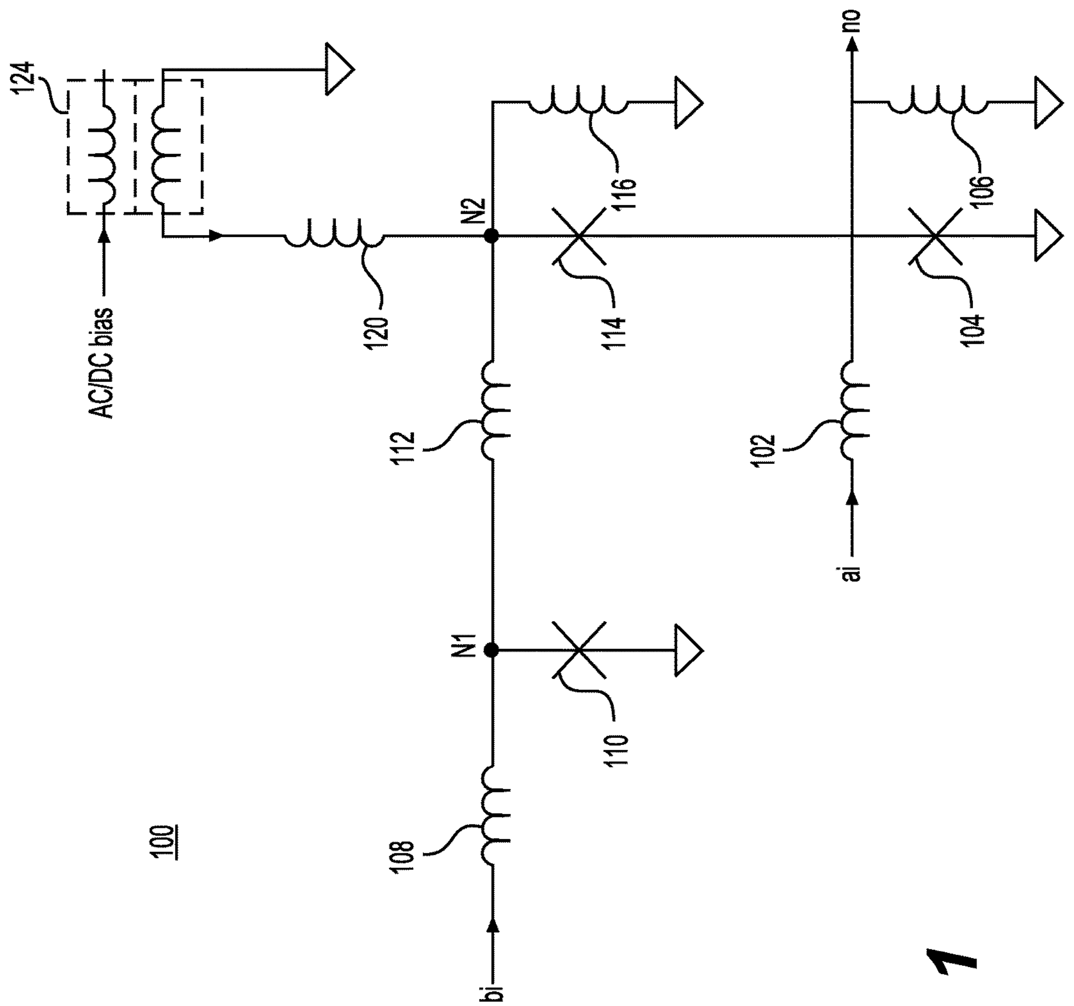
FIG. 1 is a diagram of a circuit for a reciprocal quantum logic based A-and-not-B gate in accordance with one example.

Examples described in this disclosure relate to superconducting logic-based circuits for A-and-not-B gates. Certain examples further relate to reciprocal quantum logic (RQL) based circuits for A-and-not-B gates. Such RQL based gates may include RQL circuits that may act as low-power superconductor logic circuits. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have almost zero resistance at or below their critical temperature. One example superconductor: Niobium has a critical temperature (Tc) of 9.3 Kelvin. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type of junctions, when a wave function tunnels through the barrier, a changing phase difference in time in the two superconductors creates a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power, thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B gate and a logical AND/OR gate. The A-and-not-B gate may have two inputs and one output. An input pulse A may propagate to the output when favorable clock conditions may be present on an output Josephson transmission line (JTL), unless an input pulse B comes first with respect to both the input pulse A and the favorable clock conditions on the output JTL. The logical behavior of the gate is based on the reciprocal data encoding mentioned earlier. As an example, a positive pulse changes the internal flux state of the inductive loop, but the trailing negative pulse erases the internal state every clock cycle, which in turn produces combinational logic behavior.

FIG. 1 is a diagram of a circuit for a reciprocal quantum logic based A-and-not-B gate 100 in accordance with one example. As shown in FIG. 1, the circuit for A-and-not-B gate 100 does not include any large transformers and that may make the design advantageously more area efficient. Thus, instead of using a transformer for providing current inversion, the circuits described herein may provide current inversion by arranging certain components of the circuit in a certain manner. As an example, Josephson junctions may be stacked to achieve current inversion. A-and-not-B gate 100 may be configured to receive a first signal at an input ai (input ai may be viewed as an input terminal) and a second signal at an input bi (input bi may be viewed as another input terminal) as shown in FIG. 1. A-and-not-B gate 100 may provide the signal received at the input ai as an output signal at the output no, unless its propagation is blocked by an earlier arrived signal at the input bi. In the example A-and-not-B gate 100, both AC and DC bias may be provided via transformer 124. A-and-not-B gate 100 may have the signal received via the input ai coupled to a first end of inductor 102 to provide an output signal at the output terminal (no) via a second end of inductor 102. A Josephson junction (JJ) 104 may be coupled between the second end of the inductor (also the output terminal) and the ground. Another inductor 106 may be coupled between the output terminal and the ground terminal. The signal received at the input bi may be coupled to one end of an inductor 108. The other end of inductor 108 may be coupled to a Josephson junction (JJ) 110 and to one end of another inductor 112 forming a node N1. Thus, JJ 110 may be coupled between the node N1 and the ground terminal. The other end of inductor 112 may be coupled to Josephson junction (JJ) 114 forming a node N2, as shown in FIG. 1. JJ 114 may further be coupled to JJ 104, via the output terminal, forming a stacked arrangement as shown in FIG. 1. The other end of inductor 112 may be coupled to node N2. Another inductor 116 may be coupled between the node N2 and the ground terminal. Another inductor 120 may be coupled to the node N2 and the other end of inductor 120 may be coupled to transformer 124 to receive both AC and DC bias for the circuit. In this example, the DC bias may be an amount of $\phi_0/2$. For the signal received via the input bi to be able to block the signal received via the input ai, the signal at the input bi must arrive prior to the signal at the input ai. To achieve this, the AC bias of the driver for the signal at the input bi is set 90 degrees earlier than the AC bias of the gate itself. The AC bias of the driver for the signal at the input ai need not be set earlier, which allows the signal received at the input ai to propagate faster through the gate. Although FIG. 1 shows a certain number of components of A-and-not-B gate 100 arranged in a certain manner, there could be more or fewer number of components arranged differently. As an example, in an alternative embodiment, inductor 116 may be removed from the circuit and the size of inductor 120 and the applied bias may be reduced.

Figure 2:
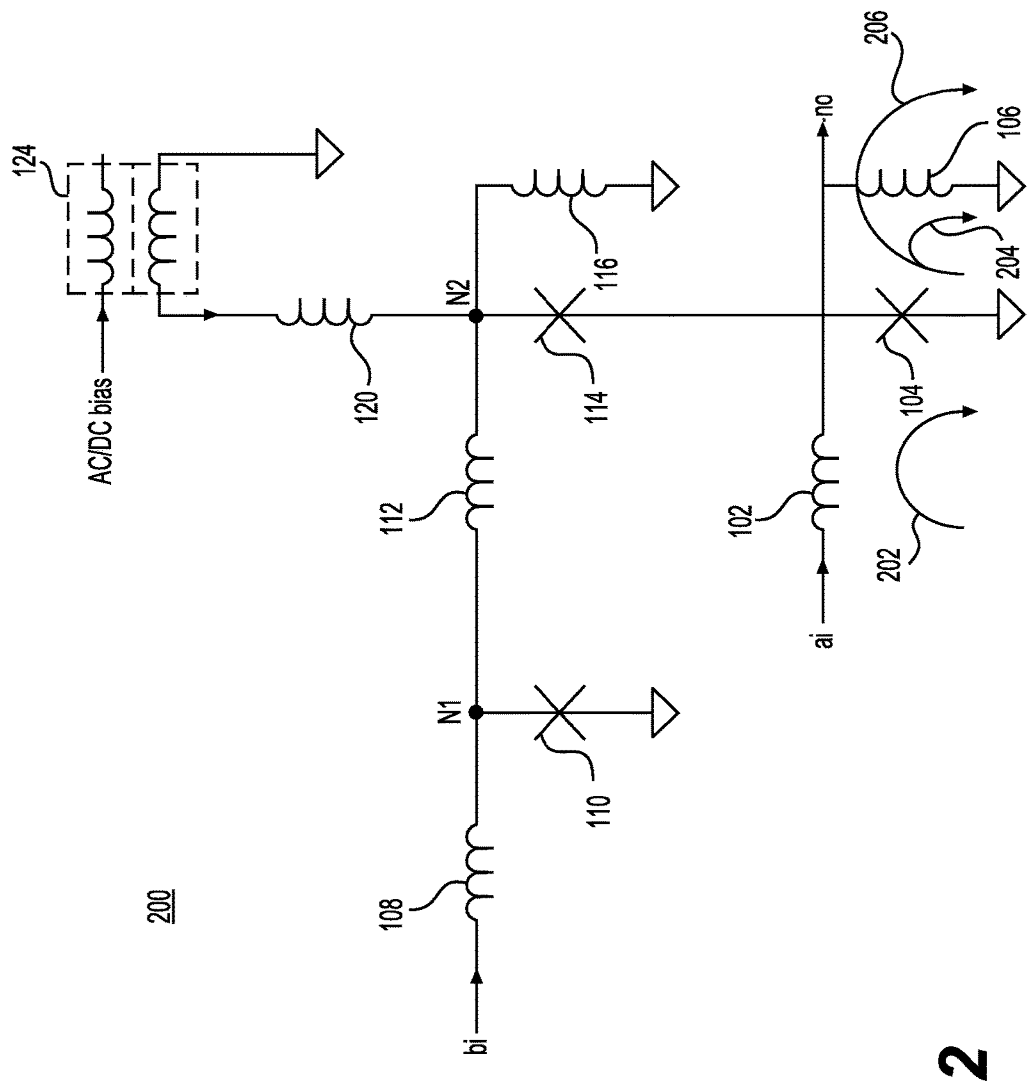
FIG. 2 is a diagram of the circuit of A-and-not-B gate of FIG. 1 during an operational state in accordance with one example.

FIG. 2 is a diagram of the circuit of A-and-not-B gate 100 of FIG. 1 during an operational state 200 in accordance with one example. Operational state 200 corresponds to the behavior of A-and-not-B gate 100 when only the input signal ai is asserted. A positive single flux quantum (SFQ) (curve 202) is input into the circuit, when an input pulse is received at the input ai and transformer 124 is supplying positive AC bias. These conditions also result in the triggering both JJ 104 and JJ 114. That in turn drives a positive SFQ pulse (curve 206) to the output no. In addition, as a side effect, a positive SFQ pulse (curve 204) is driven into inductor 106 and it is stored there. As explained later, in this example, the stored current helps with resetting the circuit for A-and-not-B gate 100. This is because, in this example, the triggering of JJ 114 prevents the reversal of the DC bias.

Figure 3:
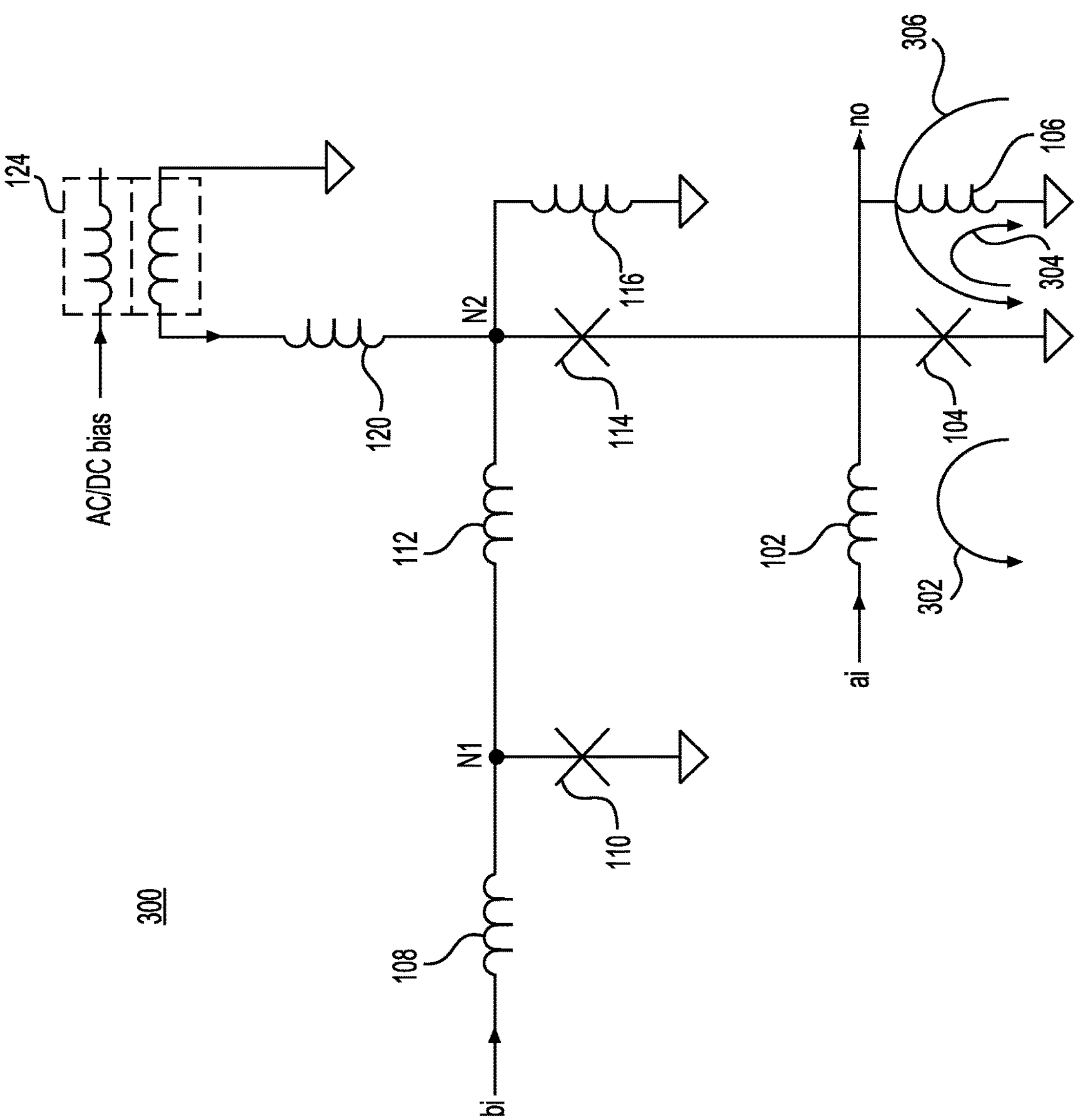
FIG. 3 is a diagram of the circuit of A-and-not-B gate of FIG. 1 during another operational state in accordance with one example.

FIG. 3 is a diagram of the circuit of A-and-not-B gate 100 of FIG. 1 during another operational state 300 in accordance with one example. Operational state 300 corresponds to the behavior of A-and-not-B gate 100 when the trailing negative SFQ pulse (curve 302) corresponding to the input ai arrives at a time when there is a negative AC bias 180 degrees later. In this example, these conditions would result in the triggering of both JJ 114 and JJ 104, resulting in a negative SFQ pulse (curve 306) at the output no and the consumption of the SFQ stored in inductor 106 (curve 304). As a result, in this example, the circuit of A-and-not-B gate 100 has been reset to the initial state.

Figure 4:
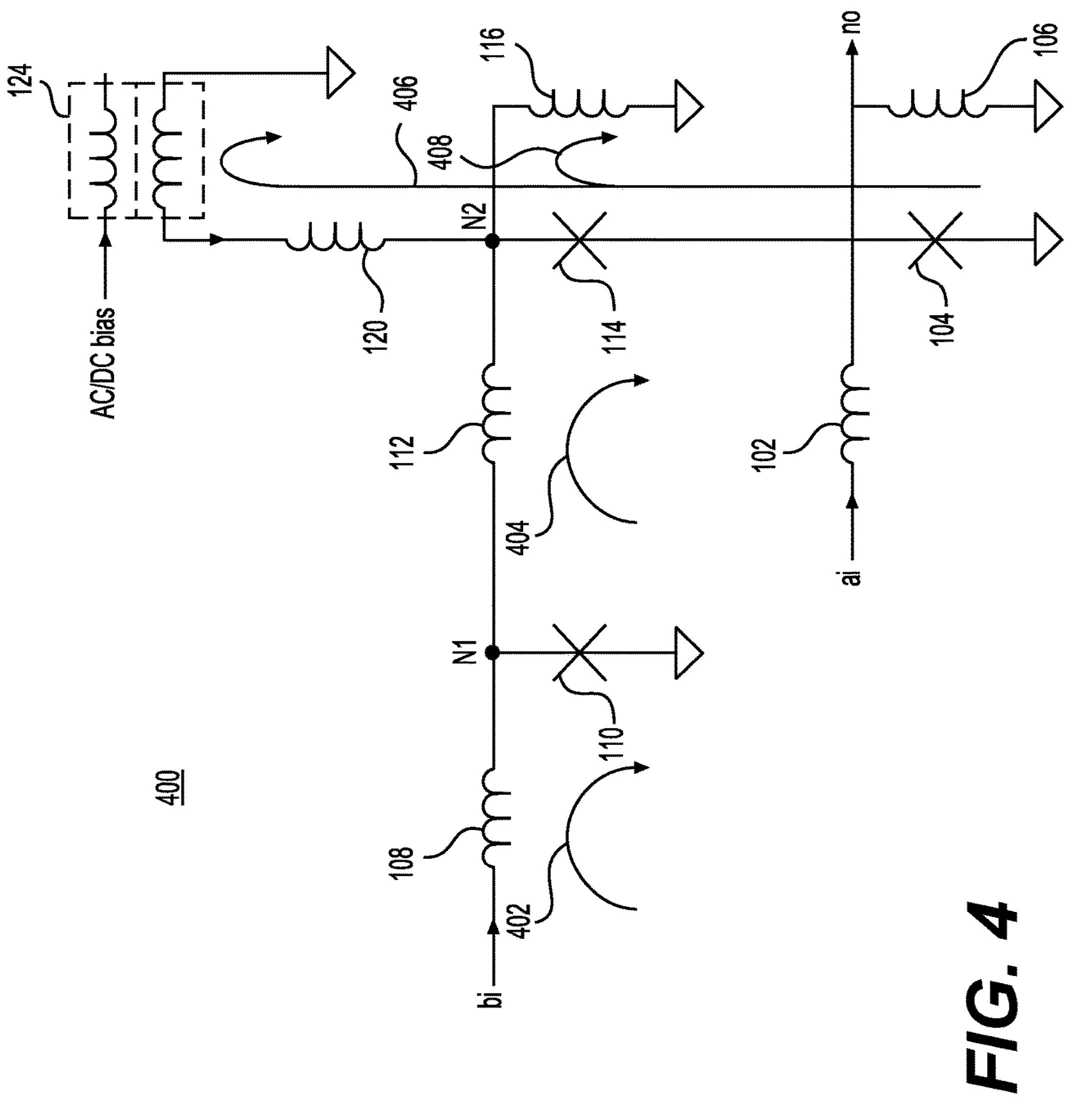
FIG. 4 is a diagram of the circuit of A-and-not-B gate of FIG. 1 during another operational state in accordance with one example.

FIG. 4 is a diagram of the circuit of A-and-not-B gate 100 of FIG. 1 during another operational state 400 in accordance with one example. Operational state 400 corresponds to an arrival of a positive SFQ pulse (curve 402) corresponding to the input bi. In this example, the SFQ pulse (curve 402) is configured to be accepted as an input when the AC bias is near zero and is rising. In this example, the SFQ pulse (curve 402) will trigger JJ 110 and thereby drive an SFQ pulse (curve 404) through inductor 112 towards JJ 114. That will result in JJ 114 triggering. In this example, JJ 114 triggers preferentially over JJ 104 because JJ 114 is smaller in size than JJ 104 and JJ 104 has additional inductive paths in parallel to it; thus JJ 114 will experience a higher amount of current than JJ 104 both from the biasing and from the SFQ pulse. The triggering of JJ 114 drives an SFQ pulse (curve 406) into AC/DC bias reversing $\phi_0/2$ of DC bias as well as storing a current generated by the positive SFQ pulse (curve 408) driven into inductor 116. In this example, the reversed DC bias of $\phi_0/2$ and the current stored in inductor 116 negatively biases JJ 114.

Figure 5:
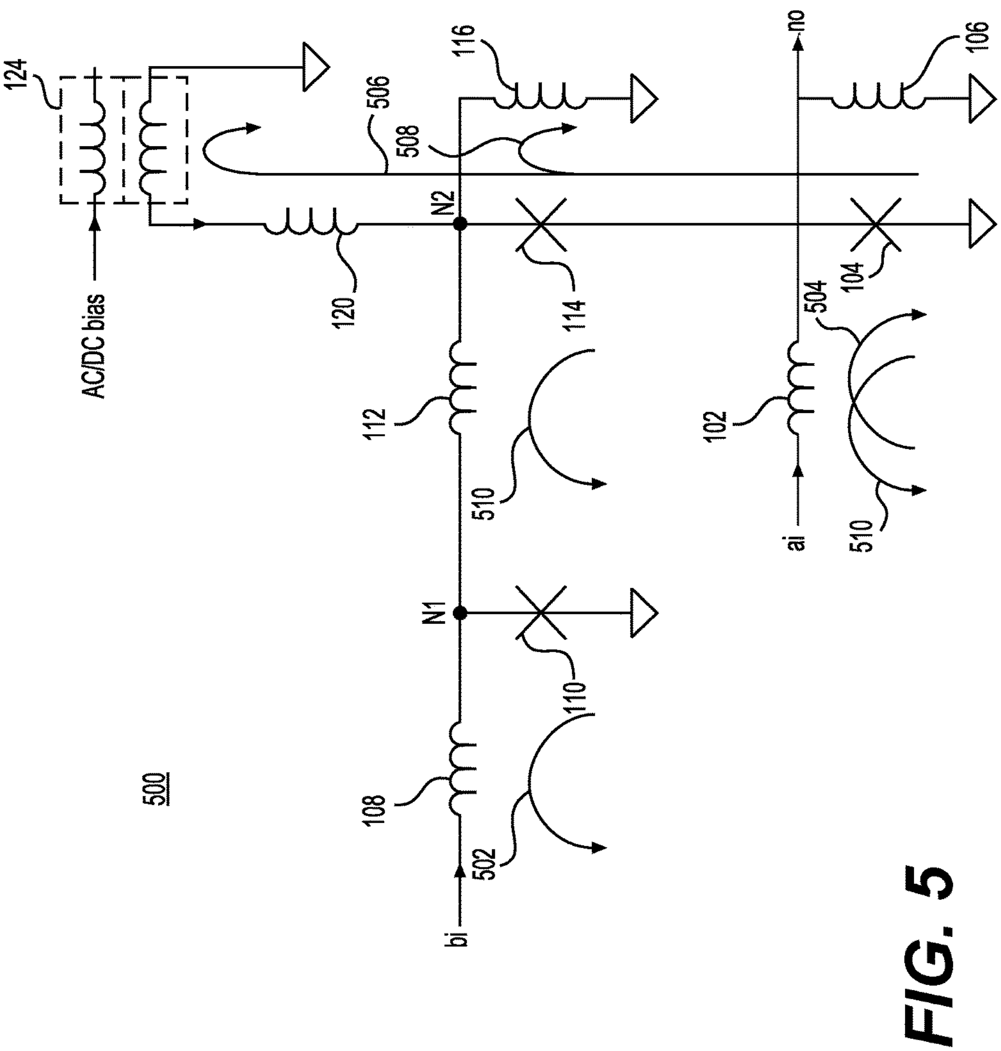
FIG. 5 is a diagram of the circuit of A-and-not-B gate of FIG. 1 during another operational state in accordance with one example.

FIG. 5 is a diagram of the circuit of A-and-not-B gate 100 of FIG. 1 during operational state 500 in accordance with one example. The stored current during the previous operational state 400 of the circuit of A-and-not-B gate 100 is shown again by curves 506 and 508 as part of operational state 500. Operational state 500 corresponds to an arrival of a positive SFQ pulse, when the AC bias provided via transformer 124 is full positive, which is driven into input ai (curve 504). However, during this state, the prior arrival of input bi has negatively biased JJ 104 and thus it fails to trigger and thereby prevents the input pulse from passing to the output no. Instead, the positive SFQ pulse is left circulating in a loop formed by inductor 102 and JJ 104. Operational state 500 further shows, after another approximately 90 degrees of the AC clock cycle, the arrival of a negative (reciprocal) SFQ pulse (curve 502). The negative SFQ pulse triggers JJ 110 and then triggers JJ 114 in an opposite direction (from the prior state), undoing the effect of the arrival of any positive SFQ pulse at the input bi. Thus, the DC biasing of JJ 104 is now restored to its original state, but the AC bias level is too negative to allow the stored current at the input ai to trigger JJ 104. Next, when the negative SFQ pulse (curve 510) is driven into the input ai, it annihilates the previously stored positive SFQ pulse in the loop formed by inductor 102 and JJ 104 and thereby returning the circuit to its initial state. While FIGS. 2-5 describe the operational states organized into certain events associated with the circuit of FIG. 1, the operational states may be described by arranging the events related to the circuit of FIG. 1 differently. In addition, while the AC bias is described as a sinusoidal waveform, other types of waveforms may also be used for AC biasing.

Figure 6:
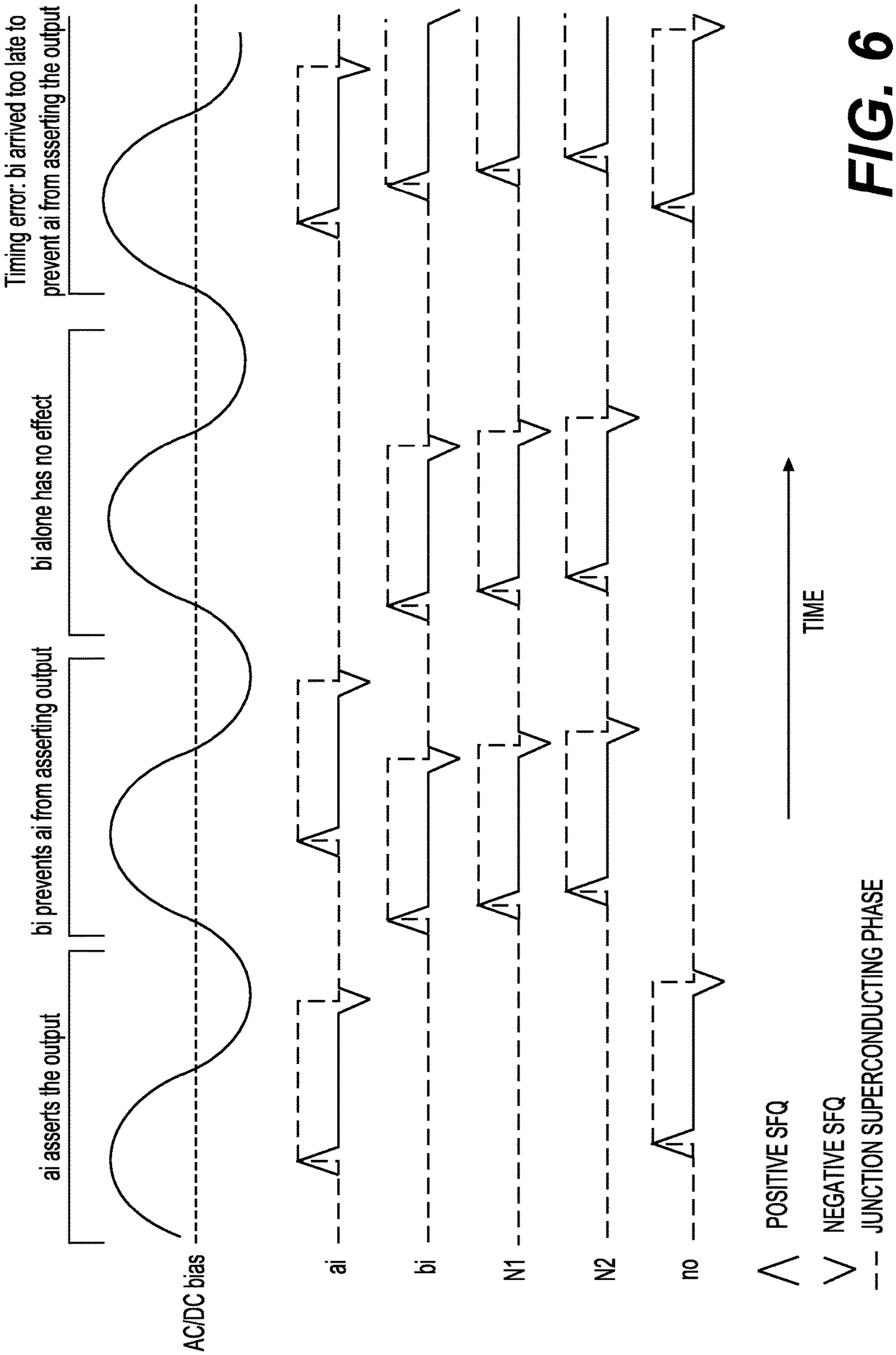
FIG. 6 shows waveforms associated with the circuit of A-and-not-B gate of FIG. 1 in accordance with one example.

FIG. 6 shows waveforms associated with the circuit of A-and-not-B gate 100 of FIG. 1 in accordance with one example. The waveforms are shown to illustrate the status of the various signals corresponding to the circuit of A-and-not-B gate 100 of FIG. 1 during four possible scenarios: (1) ai asserts the output, (2) bi prevents ai from asserting the output, (3) bi alone has no effect, and (4) timing error: bi arrived too late to prevent ai from asserting the output. During the first scenario, when a signal (e.g., a reciprocal quantum logic signal including a positive SFQ pulse trailed by a negative SFQ pulse) arrives at the input ai, it triggers JJ 104 and the signal passes to the output no. During the second scenario, a signal (e.g., a reciprocal quantum logic signal including a positive SFQ pulse trailed by a negative SFQ pulse) arrives at the input bi before the arrival of such a signal at the input ai. In this scenario, the signal triggers JJ 110 and then JJ 114, which in turn negatively biases JJ 104 and that prevents JJ 104 from triggering even upon the arrival of the signal at the input ai. During the third scenario, a signal (e.g., a reciprocal quantum logic signal including a positive SFQ pulse trailed by a negative SFQ pulse) arrives at the input bi, but no signal arrives at the input ai. This results in the triggering of JJ 110 and then JJ 114 producing no change at the output no. During the fourth scenario, a signal (e.g., a reciprocal quantum logic signal including a positive SFQ pulse trailed by a negative SFQ pulse) arrives at the input bi, but it is too late to prevent the signal that had already arrived at the input ai from passing to the output. In sum, the circuits described herein can receive a first set of single flux quantum (SFQ) pulses via a first input terminal (e.g., input ai), receive a second set of SFQ pulses via a second input terminal (e.g., input bi), and pass the first set of SFQ pulses to the output terminal in response to a triggering of a first Josephson junction (JJ) (e.g., JJ 104), coupled to the output terminal (e.g., output terminal no), unless negative biasing of the first JJ because of a triggering of a second JJ (e.g., JJ 114) coupled to the first JJ prevents the first JJ from triggering, where the triggering of the second JJ is caused at least by an arrival of the second set of SFQ pulses at the second input terminal prior to an arrival of the first set of SFQ pulses at the first input terminal.

Figure 7:
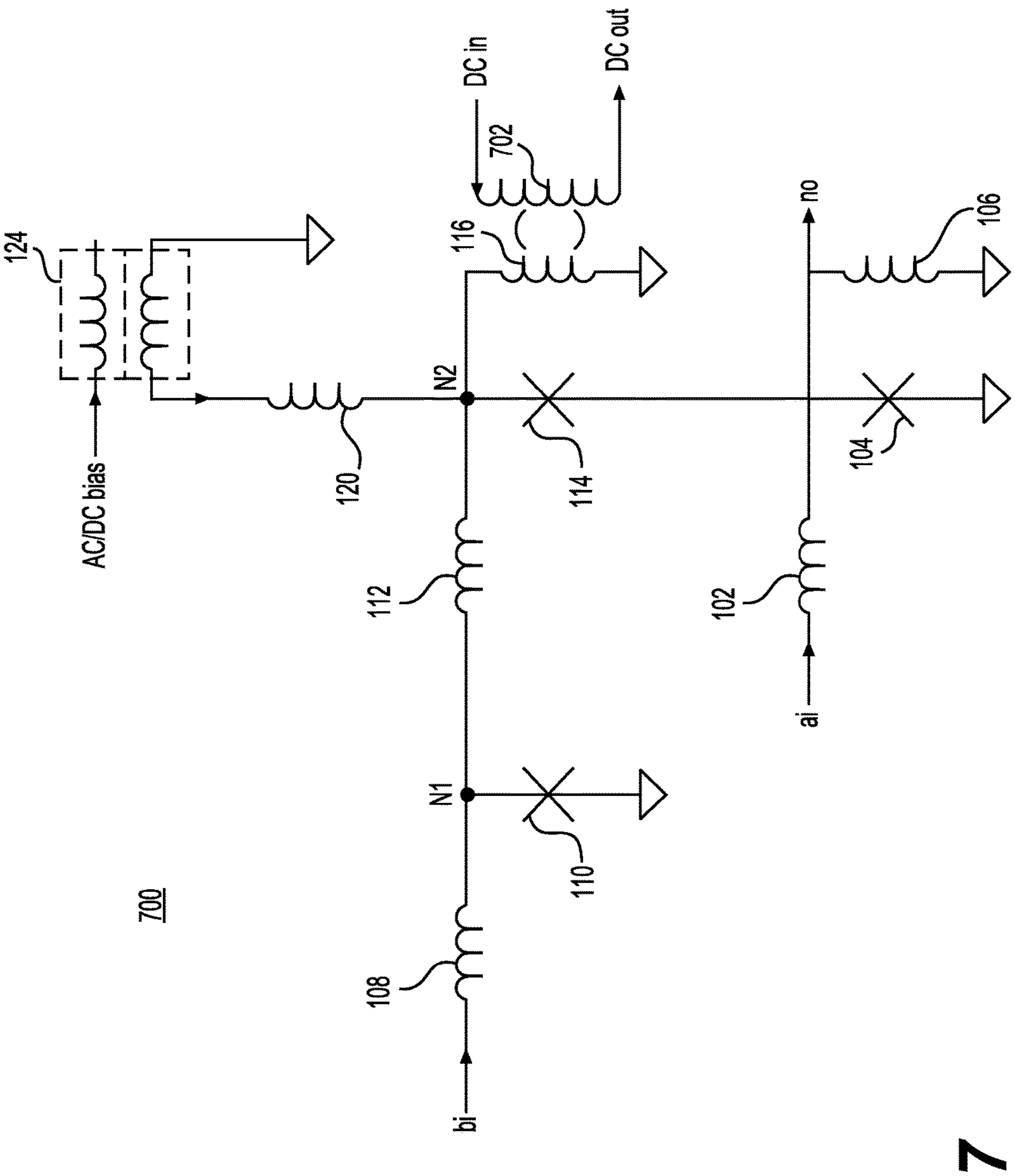
FIG. 7 is a diagram of another circuit for a reciprocal quantum logic based A-and-not-B gate in accordance with one example.

FIG. 7 is a diagram of another circuit for a reciprocal quantum logic based A-and-not-B gate 700 in accordance with one example. As shown in FIG. 7, the circuit for A-and-not-B gate 700 does not include any large transformers and that may make the design advantageously more area efficient. A-and-not-B gate 700 may be configured to receive a first signal at an input ai (input ai may be viewed as an input terminal) and a second signal at an input bi (input bi may be viewed as another input terminal) as shown in FIG. 7. A-and-not-B gate 700 may provide the signal received at the input ai as an output signal at the output no, unless its propagation is blocked by an earlier arrived signal at the input bi. In the example A-and-not-B gate 700, both AC and DC bias may be provided via transformer 124. A-and-not-B gate 700 may have the signal received via the input ai coupled to a first end of inductor 102 to provide an output signal at the output terminal (no) via a second end of inductor 102. A Josephson junction (JJ) 104 may be coupled between the second end of the inductor (also the output terminal) and the ground. Another inductor 106 may be coupled between the output terminal and the ground terminal. The signal received at the input bi may be coupled to one end of an inductor 108. The other end of inductor 108 may be coupled to a Josephson junction (JJ) 110 and to one end of another inductor 112 forming a node N1. Thus, JJ 110 may be coupled between the node N1 and the ground terminal. The other end of inductor 112 may be coupled to Josephson junction (JJ) 114 forming a node N2, as shown in FIG. 1. JJ 114 may further be coupled to JJ 104, via the output terminal, forming a stacked arrangement as shown in FIG. 1. The other end of inductor 112 may be coupled to node N2. Another inductor 116 may be coupled to the node N2 and the ground terminal. Another inductor 120 may be coupled to the node N2 and the other end of inductor 120 may be coupled to transformer 124 to receive both AC and DC bias for the circuit. In this example, the DC bias may be an amount of $\phi_0/2$. Unlike the circuit for A-and-not-B gate 100, the circuit for A-and-not-B gate 700 may further include the application of a DC bias of $\phi_0/2$ to inductor 116 via transformer 702. In this example, the additional bias may help improve the operating margins of the circuit. Aside from the improved operating margin, the circuit for A-and-not-B gate 700 operates in a similar fashion as explained with respect to FIGS. 2-6. Although FIG. 7 shows a certain number of components of the circuit for A-and-not-B gate 700 arranged in a certain manner, there could be more or fewer number of components arranged differently.

In conclusion, the present disclosure relates to a circuit for an A-and-not-B gate including an output terminal, a first input terminal for receiving a first set of single flux quantum (SFQ) pulses, and a second input terminal for receiving a second set of SFQ pulses. The circuit may further include a first Josephson junction (JJ) coupled to receive the first set of SFQ pulses. The circuit may further include a second JJ coupled to the first JJ, where the second JJ when positively biased is configured to negatively bias the first JJ such that the circuit is configured to not pass the first set of SFQ pulses to the output terminal only when the second set of SFQ pulses have arrived at the second input terminal prior to an arrival of the first set of SFQ pulses at the first input terminal.

The first JJ may be coupled to the output terminal, and the circuit may further comprise a first inductor coupled between the first input terminal and the output terminal. The circuit may further comprise a third JJ coupled to a first node, and the circuit may further comprise a second inductor coupled between the second input terminal and the first node. The circuit may further comprise a third inductor coupled to a second node, where the second node is further coupled to the second JJ and a fourth inductor. The fourth inductor may be coupled to receive both an alternating current bias and a direct current bias via a transformer.

The circuit may further comprise a fifth inductor coupled between the output terminal and a ground terminal and a sixth inductor coupled between the second node and the ground terminal. The second JJ may be directly coupled to the output terminal resulting in a stacked arrangement of the first JJ and the second JJ.

In another aspect, the present disclosure relates to a circuit an A-and-not-B gate including an output terminal, a first input terminal for receiving a first set of single flux quantum (SFQ) pulses, and a second input terminal for receiving a second set of SFQ pulses. The circuit may further include a first Josephson junction (JJ) coupled to receive the first set of SFQ pulses, where the first JJ having a first end coupled to a first node and having a second end coupled to a ground terminal. The circuit may further include a second JJ having a first end directly coupled to the output terminal, where the second JJ when positively biased is configured to negatively bias the first JJ such that the circuit is configured to not pass the first set of SFQ pulses to the output terminal only when the second set of SFQ pulses have arrived at the second input terminal prior to an arrival of the first set of SFQ pulses at the first input terminal.

The circuit may further include a first inductor coupled between the first input terminal and the output terminal. The circuit may further include a third JJ coupled to a first node, and the circuit may further comprise a second inductor coupled between the second input terminal and the first node. The circuit may further include a third inductor coupled to a second node, where the second node may further be coupled to the second JJ and a fourth inductor.

The fourth inductor may be coupled to receive both an alternating current bias and a direct current bias via a transformer. The circuit may further include a fifth inductor coupled between the output terminal and a ground terminal and a sixth inductor coupled between the second node and the ground terminal. The sixth inductor may be coupled to receive an additional direct current bias.

In yet another aspect, the present disclosure relates to a method of operating a circuit for an A-and-not-B gate, where the circuit includes an output terminal. The method may include receiving a first set of single flux quantum (SFQ) pulses via a first input terminal. The method may further include receiving a second set of SFQ pulses via a second input terminal. The method may further include passing the first set of SFQ pulses to the output terminal in response to a triggering of a first Josephson junction (JJ), coupled to the output terminal, unless negative biasing of the first JJ because of triggering of a second JJ coupled to the first JJ prevents the first JJ from triggering, where the triggering of the second JJ is caused at least by an arrival of the second set of SFQ pulses at the second input terminal prior to an arrival of the first set of SFQ pulses at the first input terminal.

The circuit may further comprise a first inductor coupled between the first input terminal and the output terminal. The circuit may further comprise a third JJ coupled to a first node, and the circuit may further comprise a second inductor coupled between the second input terminal and the first node. The circuit may further include a third inductor coupled to a second node, where the second node may further be coupled to the second JJ and a fourth inductor.

The fourth inductor may be coupled to receive both an alternating current bias and a direct current bias via a transformer. The circuit may further include a fifth inductor coupled between the output terminal and a ground terminal and a sixth inductor coupled between the second node and the ground terminal.

It is to be understood that the methods, modules, devices, systems, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner.

Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A circuit for an A-and-not-B gate comprising:
- an output terminal;
- a first input terminal for receiving a first set of single flux quantum (SFQ) pulses;
- a second input terminal for receiving a second set of SFQ pulses;
- a first Josephson junction (JJ) coupled to receive the first set of SFQ pulses; and
- a second JJ coupled to the first JJ, wherein the second JJ is configured to negatively bias the first JJ such that the circuit is configured to not pass the first set of SFQ pulses to the output terminal only when the second set of SFQ pulses have arrived at the second input terminal prior to an arrival of the first set of SFQ pulses at the first input terminal.

2. The circuit of claim 1, wherein the first JJ is coupled to the output terminal, and wherein the circuit further comprises a first inductor coupled between the first input terminal and the output terminal.

3. The circuit of claim 2, wherein the circuit further comprises a third JJ coupled to a first node, and wherein the circuit further comprises a second inductor coupled between the second input terminal and the first node.

4. The circuit of claim 3 further comprising a third inductor coupled to a second node, wherein the second node is further coupled to the second JJ and a fourth inductor.

5. The circuit of claim 4, wherein the fourth inductor is coupled to receive both an alternating current bias and a direct current bias via a transformer.

6. The circuit of claim 5 further comprising a fifth inductor coupled between the output terminal and a ground terminal and a sixth inductor coupled between the second node and the ground terminal.

7. The circuit of claim 2, wherein the second JJ is directly coupled to the output terminal resulting in a stacked arrangement of the first JJ and the second JJ.

8. A circuit for an A-and-not-B gate comprising:
- an output terminal;
- a first input terminal for receiving a first set of single flux quantum (SFQ) pulses;
- a second input terminal for receiving a second set of SFQ pulses;
- a first Josephson junction (JJ) coupled to receive the first set of SFQ pulses, wherein the first JJ having a first end coupled to a first node and having a second end coupled to a ground terminal; and
- a second JJ having a first end directly coupled to the output terminal, wherein the second JJ is configured to negatively bias the first JJ such that the circuit is configured to not pass the first set of SFQ pulses to the output terminal only when the second set of SFQ pulses have arrived at the second input terminal prior to an arrival of the first set of SFQ pulses at the first input terminal.

9. The circuit of claim 8 further comprising a first inductor coupled between the first input terminal and the output terminal.

10. The circuit of claim 9, wherein the circuit further comprises a third JJ coupled to a first node, and wherein the circuit further comprises a second inductor coupled between the second input terminal and the first node.

11. The circuit of claim 10 further comprising a third inductor coupled to a second node, wherein the second node is further coupled to the second JJ and a fourth inductor.

12. The circuit of claim 11, wherein the fourth inductor is coupled to receive both an alternating current bias and a direct current bias via a transformer.

13. The circuit of claim 12 further comprising a fifth inductor coupled between the output terminal and a ground terminal and a sixth inductor coupled between the second node and the ground terminal.

14. The circuit of claim 13, wherein the sixth inductor is coupled to receive an additional direct current bias.

15. A method of operating a circuit for an A-and-not-B gate, wherein the circuit including an output terminal, the method comprising:
- receiving a first set of single flux quantum (SFQ) pulses via a first input terminal;
- receiving a second set of SFQ pulses via a second input terminal; and
- passing the first set of SFQ pulses to the output terminal in response to a triggering of a first Josephson junction (JJ), coupled to the output terminal, unless negative biasing of the first JJ because of triggering of a second JJ coupled to the first JJ prevents the first JJ from triggering, wherein the triggering of the second JJ is caused at least by an arrival of the second set of SFQ pulses at the second input terminal prior to an arrival of the first set of SFQ pulses at the first input terminal.

16. The method of claim 15, wherein the circuit further comprises a first inductor coupled between the first input terminal and the output terminal.

17. The method of claim 16, wherein the circuit further comprises a third JJ coupled to a first node, and wherein the circuit further comprises a second inductor coupled between the second input terminal and the first node.

18. The method of claim 17, wherein the circuit further comprises a third inductor coupled to a second node, wherein the second node is further coupled to the second JJ and a fourth inductor.

19. The method of claim 18, wherein the fourth inductor is coupled to receive both an alternating current bias and a direct current bias via a transformer.

20. The method of claim 19, wherein the circuit further comprises a fifth inductor coupled between the output terminal and the ground terminal and a sixth inductor coupled between the second node and the ground terminal.

* * * * *